US008674696B2

(12) United States Patent
Boettcher

(10) Patent No.: US 8,674,696 B2
(45) Date of Patent: Mar. 18, 2014

(54) RECEIVER COIL TO MEASURE X-NUCLEI SIGNALS AND MAGNETIC RESONANCE APPARATUS WITH SUCH A RECEIVER COIL

(75) Inventor: Uwe Boettcher, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 382 days.

(21) Appl. No.: 13/208,621

(22) Filed: Aug. 12, 2011

(65) Prior Publication Data

US 2012/0038361 A1 Feb. 16, 2012

(30) Foreign Application Priority Data

Aug. 13, 2010 (DE) .......................... 10 2010 039 302

(51) Int. Cl.
*G01V 3/00* (2006.01)
(52) U.S. Cl.
USPC .......................................................... 324/318

(58) Field of Classification Search
USPC .................................................. 324/300–322
See application file for complete search history.

(56) References Cited

U.S. PATENT DOCUMENTS

| 4,677,382 | A | 6/1987 | Vatis |
| 5,442,292 | A | 8/1995 | Kolem et al. |
| 6,278,277 | B1 | 8/2001 | Zeiger |
| 8,513,835 | B2 * | 8/2013 | Urano ........................... 307/104 |
| 2005/0168223 | A1 | 8/2005 | Zeiger et al. |
| 2011/0276101 | A1* | 11/2011 | Lee et al. ........................... 607/2 |
| 2012/0001494 | A1* | 1/2012 | Urano ........................... 307/104 |

* cited by examiner

*Primary Examiner* — Dixomara Vargas
(74) *Attorney, Agent, or Firm* — Schiff Hardin LLP

(57) ABSTRACT

A reception coil, in particular local coil, to measure X-nuclei signals in magnetic resonance spectroscopy, has at least one filter connected in a first signal path to filter out radio-frequency pulses radiated by a transmission coil during a measurement, and a second signal path bypassing the filter. At least one switching arrangement is provided to switch between these signal paths.

9 Claims, 2 Drawing Sheets

RECEIVER COIL TO MEASURE X-NUCLEI SIGNALS AND MAGNETIC RESONANCE APPARATUS WITH SUCH A RECEIVER COIL

BACKGROUND OF THE INVENTION

1. Field of the Invention

The invention concerns a receiver coil, in particular a local coil, to measure x-nuclei signals in magnetic resonance spectroscopy, of the type having at least one filter connected in a first signal path to filter out radio-frequency pulses radiated via a transmission coil during a measurement. The invention also concerns a magnetic resonance apparatus.

2. Description of the Prior Art

In the field of magnetic resonance spectroscopy it is also known to measure signals from non-proton nuclei, known as x-nuclei. Achieving a sufficient signal-to-noise ratio in view of the reduced sensitivity of many nuclei is thereby of central importance. It is known to use a decoupling technique to increase the signal-to-noise ratio and to simplify multiplet signals. However, the decoupling technique requires the radiation of radio-frequency pulses during the data acquisition (the measurement). In order for the radio-frequency pulses to not negatively influence the measurement, it is known to use at least one filter in the reception path and in the transmission path. However, these filters produce an attenuation of the signal which leads to a decrease of the signal-to-noise ratio in the signal path of the reception coil.

Reception coils with such filters plugged into the signal path are known, for example in 31P-1H heart-liver coils and the like. Such a reception coil can also include a separate filter box that is inserted into the reception path, but this leads to a more complicated and more expensive workflow and generates additional error sources.

The reduction of the signal-to-noise ratio that is described above by the attenuation of the signal due to the additional filters is disadvantageous when specific measurements do not require any additional radio-frequency pulses at all for decoupling.

SUMMARY OF THE INVENTION

An object of the present invention is to provide a reception coil in which an improvement of the signal-to-noise ratio is possible at least in cases in which no radio-frequency pulses are used during the data acquisition.

According to the invention, this object is achieved by a reception coil of the aforementioned general type that is provided with a second signal path bypassing the filter and at least one switching arrangement to switch between the signal paths.

A measurement-dependent signal path is consequently advantageously realized in the reception path of the coil electronics. In the event that the at least one present filter is not necessary for the currently implemented measurement, it can be circumvented by switching by the operation of the switching arrangement. A reduction of the signal-to-noise ratio by means of the filter is induced only when this is absolutely necessary, and otherwise is avoided. If a measurement is implemented that does not require the additional filters for decoupling experiments, these filters are bypassed by the second signal path and an active circuit so that an unnecessary loss in signal-to-noise ratio is avoided, as would otherwise occur given a fixed wiring of these filters.

In a further embodiment of the invention the switching arrangement is manually operable. This means that, by the intervention of an operator depending on the measurement to be implemented, it can be set as to whether the filters in the first signal path are used or are bypassed by the second signal path.

In a further embodiment of the invention, the switching arrangement can be switched (operated) by an internal and/or external control device, in particular a control device of a magnetic resonance device. In this case an activation of the switching arrangement that is integrated into the complete system controller can be produced so that the switching arrangement to be switched in the measurement sequence depending on the presence of radio-frequency pulses during the measurement. This means that, since the measurement sequence of the control device is known or will be made known, depending on the set measurement sequence the control device is automatically able to detect whether radio-frequency pulses occur during the measurement or not, and consequently whether the filter is required or not. If no radio-frequency pulses are provided in the measurement sequence to be implemented during the data acquisition, the switching arrangement thus is switched to the second signal path. If radio-frequency pulses are provided during the data acquisition; the first signal path with the filter is thus used.

In other embodiments, multiple filters are provided, for example a filter adjacent to the coil conductor and a filter installed in the coil electronics. At least two spatially separate first signal paths are thus provided with filters and at least two second signal paths corresponding to these filters. The spatially separate filters are thus respectively separately bypassed.

In a further embodiment of the present invention, at least two adjacent first signal paths and a second signal path associated with this are provided, with the second or one of the first signal paths being switched to by the switching arrangement. Specifically given coils that are to measure different non-proton nuclei, the radio-frequency pulses that occur during the measurement are at different frequencies. For each of these frequencies, filters can be provided that can be switched dynamically just like the second signal path, in particular by the control device.

For example, the switching arrangement can be fashioned as a relay and/or as a semiconductor switch. Various types are possible, depending on the specific embodiment of the coil.

In addition to the reception coil, the present invention also concerns a magnetic resonance device with a reception coil according to the invention. All features and advantages that have been described with regard to the reception coil apply analogously to the magnetic resonance device according to the invention.

The magnetic resonance device can also include a control device fashioned to activate the switching arrangement depending on the selected measurement sequence. A central control device is then provided to which the measurement sequences to be implemented are known, and the control device sets the switching arrangement to the first signal path or the second signal path corresponding to the fact of whether radio-frequency pulses are provided or not during the data acquisition.

DESCRIPTION OF THE PREFERRED EMBODIMENTS

Figure 1:
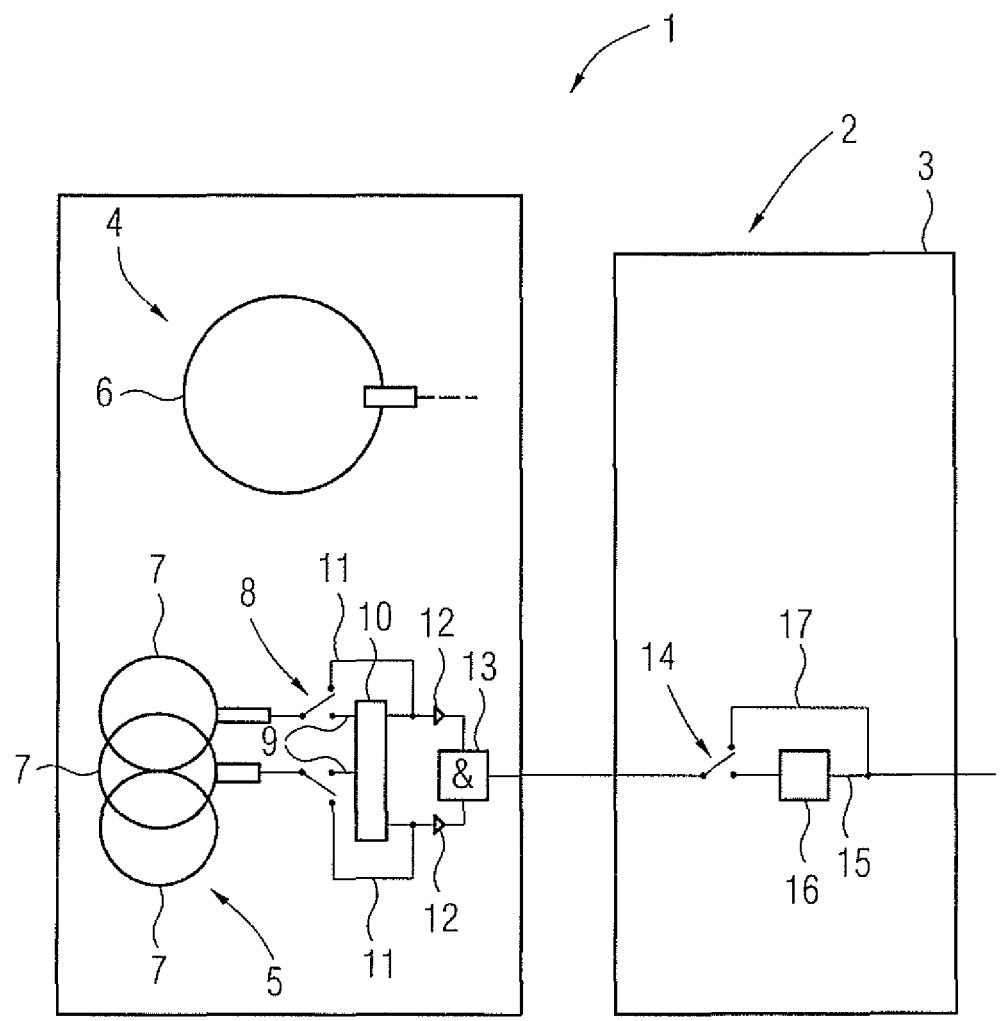
FIG. 1 is a schematic block diagram of a reception coil according to the invention.

FIG. 1 is a block diagram of a reception coil 1 according to the invention that is fashioned to receive signals originating from non-proton nuclei, known as X-nuclei. For example, this can be a 31P/1H local coil that is often used for heart and liver acquisitions.

In addition to electronics 2 (which can be provided in an adapter box 3, for example) the reception coil 1 has two loops 4, 5. The loop 4 is a type known as an LP loop for linearly polarized signals. The loop 4 is formed by a single conductor loop 6 and used to transmit both 1H and 31P signals, but only to receive 1H signals.

The second loop 5 is fashioned as a CP butterfly loop for circularly polarized signals and has three overlapping conductor loops 7 that serve to receive the 31P measurement signals. While the signal path of the LP loop 4 is not shown in detail for clarity, the signal path of the CP butterfly loop 5 is shown.

Both received signals initially pass through a switching arrangement 8 via which a selection can be made respectively between a first signal path 9 with a filter 10 that filters out interference signals due to radio-frequency pulses during the data acquisition, and a second signal path 11 without a filter. After the signals are then amplified by preamplifiers 12, they are supplied to a combiner 13 that merges the signals.

In the adapter box 3 an additional switching arrangement 14 is provided with which a switch can likewise be made between a first signal path 15 with an additional filter 16 and a second signal path 17 without a filter.

The switching arrangement 8, 14 (that can be each fashioned as a relay) can be activated by an external control device. This external control device switches the switching arrangement 8, 14 to the first signal paths 9, 15 when the filters 10, 16 are required, so radio-frequency pulses occur in the current measurement sequence during the data acquisition. If no radio-frequency pulses should occur in the current data acquisition with the measurement sequence, the signals are conducted via the second signal path 11, 17 without a filter.

It should be noted that multiple first signal paths 9, 15 with different filters can also be provided, and it is then also possible to switch between the different filters via the switching arrangements 8, 14.

Figure 2:
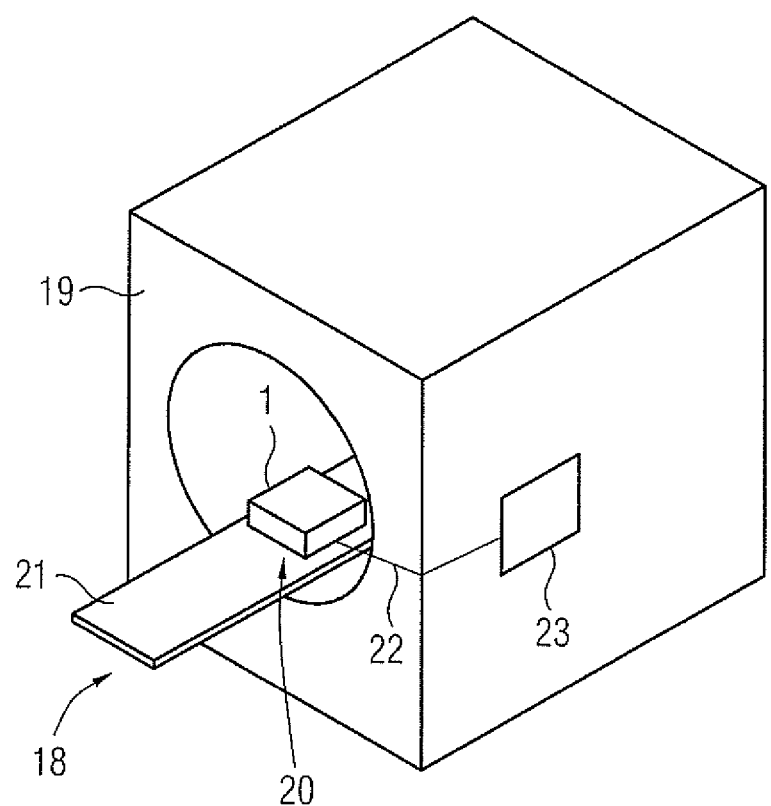
FIG. 2 schematically illustrates a magnetic resonance device according to the invention.

FIG. 2 shows basic components of a magnetic resonance device 18 according to the invention. As is generally known, a patient receptacle 20 into which a patient bed 21 can be driven is provided in a magnet housing 19. The reception coil 1 is arranged on the patient bed 21. The reception coil 1 is connected via a communication connection 22 with the control device 23, which is configured to activate the switching arrangements 8, 14 according to the currently used measurement sequence.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance spectroscopy reception coil, comprising:
   a first signal path configured to receive signals originating from X-nuclei in a magnetic resonance spectroscopy data acquisition procedure, said data acquisition procedure including radiation of radio-frequency pulses by a transmission coil;
   a filter connected in said first signal path that filters out said radio-frequency pulses radiated by said transmission coil;
   a second signal path that bypasses said filter; and
   a switch that switches between said first and second signal paths.

2. A reception coil as claimed in claim 1 wherein said switch is a manually operable switch.

3. A reception coil as clamed in claim 1 comprising a control device that electronically switches said switch between said first and second signal paths.

4. A reception coil as clamed in claim 3 wherein said control device switches said switch in said data acquisition procedure dependent on a presence of said radio-frequency pulses in said data acquisition procedure.

5. A reception coil as clamed in claim 1 wherein said first signal path is a first first signal path and wherein said filter is a first filter, and wherein said second signal path is a first second signal path, and comprising a second first signal path provided with a second filter, and a second second signal path that bypasses said second filter in said second first signal path.

6. A reception coil as darned in claim 1 wherein said first signal path is a first first signal path and wherein said filter is a first filter, and comprising a second first signal path with a second filter that filters out said radio-frequency pulses, and wherein said switch switches between said second signal path and one of said first first signal path and said second first signal path.

7. A reception coil as darned in claim 1 wherein said switch is a relay.

8. A magnetic resonance apparatus comprising:
   a data acquisition unit operable to implement a magnetic resonance spectroscopy data acquisition procedure;
   said data acquisition unit comprising a transmission coil that radiates radio-frequency pulses during said data acquisition procedure; and
   a reception coil comprising a first signal path configured to receive signals originating from X-nuclei in a magnetic resonance spectroscopy data acquisition procedure, said data acquisition procedure including radiation of radio-frequency pulses by a transmission coil, a filter connected in said first signal path that filters out said radio-frequency pulses radiated by said transmission coil, a second signal path that bypasses said filter, and a switch that switches between said first and second signal paths.

9. A magnetic resonance apparatus as claimed in claim 8 comprising a control unit configured to electronically switch said switch dependent on whether said data acquisition procedure comprises transmission of radio-frequency pulses by said transmission coil.

* * * * *